(12) United States Patent
Chang

(10) Patent No.: US 8,319,885 B2
(45) Date of Patent: Nov. 27, 2012

(54) DETACHABLE CAMERA MODULE

(75) Inventor: Jen-Tsorng Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 88 days.

(21) Appl. No.: 12/732,197

(22) Filed: Mar. 26, 2010

(65) Prior Publication Data

US 2011/0043687 A1 Feb. 24, 2011

(30) Foreign Application Priority Data

Aug. 24, 2009 (CN) .......................... 2009 1 0305993

(51) Int. Cl.
*H04N 5/225* (2006.01)

(52) U.S. Cl. ........................................ 348/374; 348/340

(58) Field of Classification Search .................. 348/335, 348/340, 373–375; 257/432–435
See application file for complete search history.

(56) References Cited

U.S. PATENT DOCUMENTS

| 7,304,684 B2 * | 12/2007 | Segawa et al. ................. 348/374 |
| 7,361,880 B2 * | 4/2008 | Webster ...................... 250/208.1 |
| 7,515,817 B2 * | 4/2009 | Shiraishi et al. ................ 396/89 |
| 7,609,322 B2 * | 10/2009 | Takada .......................... 348/374 |
| 7,619,684 B2 * | 11/2009 | Nishida et al. ................. 348/374 |
| 7,782,391 B2 * | 8/2010 | Lin ............................... 348/340 |
| 7,988,371 B2 * | 8/2011 | Aoki et al. ..................... 396/529 |
| 2002/0057468 A1 * | 5/2002 | Segawa et al. ................. 358/509 |
| 2002/0140836 A1 * | 10/2002 | Miyake et al. ................. 348/340 |
| 2002/0145676 A1 * | 10/2002 | Kuno et al. .................... 348/340 |
| 2002/0167605 A1 * | 11/2002 | Akimoto et al. ............... 348/374 |
| 2004/0056971 A1 * | 3/2004 | Yang et al. ..................... 348/294 |
| 2004/0223074 A1 * | 11/2004 | Takada .......................... 348/360 |
| 2005/0129384 A1 * | 6/2005 | Nishida et al. ................. 385/147 |
| 2005/0141106 A1 * | 6/2005 | Lee et al. ....................... 359/808 |
| 2005/0174469 A1 * | 8/2005 | Cho et al. ...................... 348/340 |
| 2005/0213251 A1 * | 9/2005 | Hanyu ........................ 360/236.1 |
| 2006/0152826 A1 * | 7/2006 | Tsutsui ......................... 359/824 |
| 2006/0181633 A1 * | 8/2006 | Seo ............................... 348/340 |
| 2007/0019101 A1 * | 1/2007 | Minamio et al. ............... 348/335 |
| 2007/0040932 A1 * | 2/2007 | Chen ............................. 348/374 |
| 2008/0043139 A1 * | 2/2008 | Lee et al. ....................... 348/375 |
| 2009/0033790 A1 * | 2/2009 | Lin ............................... 348/374 |
| 2010/0165183 A1 * | 7/2010 | Tian .............................. 348/374 |
| 2010/0265389 A1 * | 10/2010 | Mizumura .................... 348/374 |

FOREIGN PATENT DOCUMENTS

CN 101339282 1/2009

* cited by examiner

*Primary Examiner* — John Villecco
*Assistant Examiner* — Selam Gebriel
(74) *Attorney, Agent, or Firm* — Altis Law Group, Inc.

(57) ABSTRACT

An exemplary camera module includes an image sensor package, an enclosure, and a lens module. The image sensor package includes a circuit board and an image sensor mounted on the circuit board. The enclosure is attached on the circuit board and includes four elastic engaging portions protruding from an interior surface thereof. The lens module includes a barrel and at least one optical element received in the barrel. The barrel defines four recesses in an outer surface thereof. The barrel is detachably mounted in the enclosure. The engaging portions engage in the respective recesses.

18 Claims, 9 Drawing Sheets

DETACHABLE CAMERA MODULE

BACKGROUND

1. Technical Field

The disclosure generally relates to camera modules, and particularly to a camera module that can be easily assembled and disassembled.

2. Description of Related Art

A typical camera module includes a holder, a barrel, a number of optical elements (e.g., lenses and infrared-cut filters), and an image sensor mounted on a circuit board. In assembly of the camera module, the image sensor is received in the holder. The optical elements are received in the barrel in sequence, and the barrel is threadedly coupled to the holder. However, the camera module generally has complicated structure, and is not easily assembled and disassembled.

Therefore, what is needed is a camera module that can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the various views.

DETAILED DESCRIPTION

Embodiments will now be described in detail below, with reference to the drawings.

Figure 1:
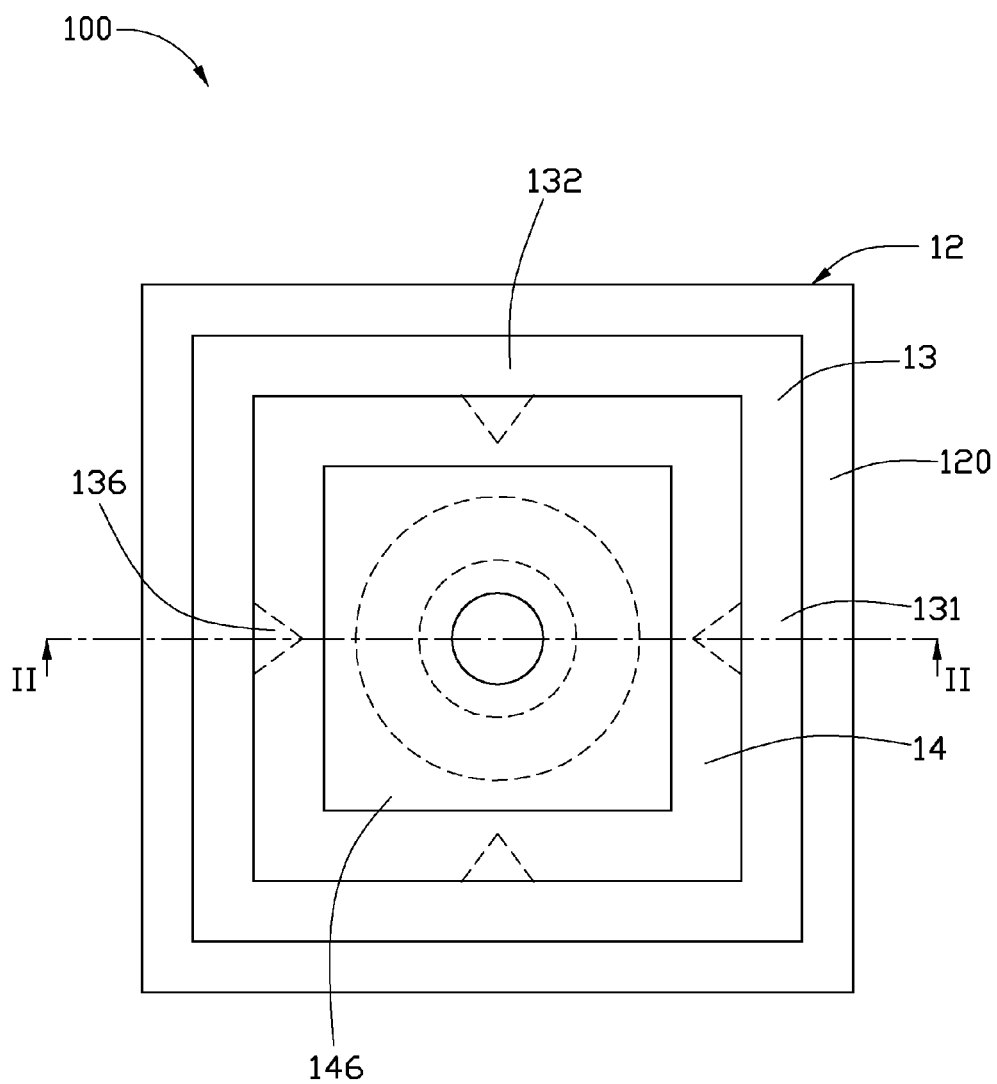
FIG. 1 is a top plan view of a camera module according to a first embodiment.
Figure 2:
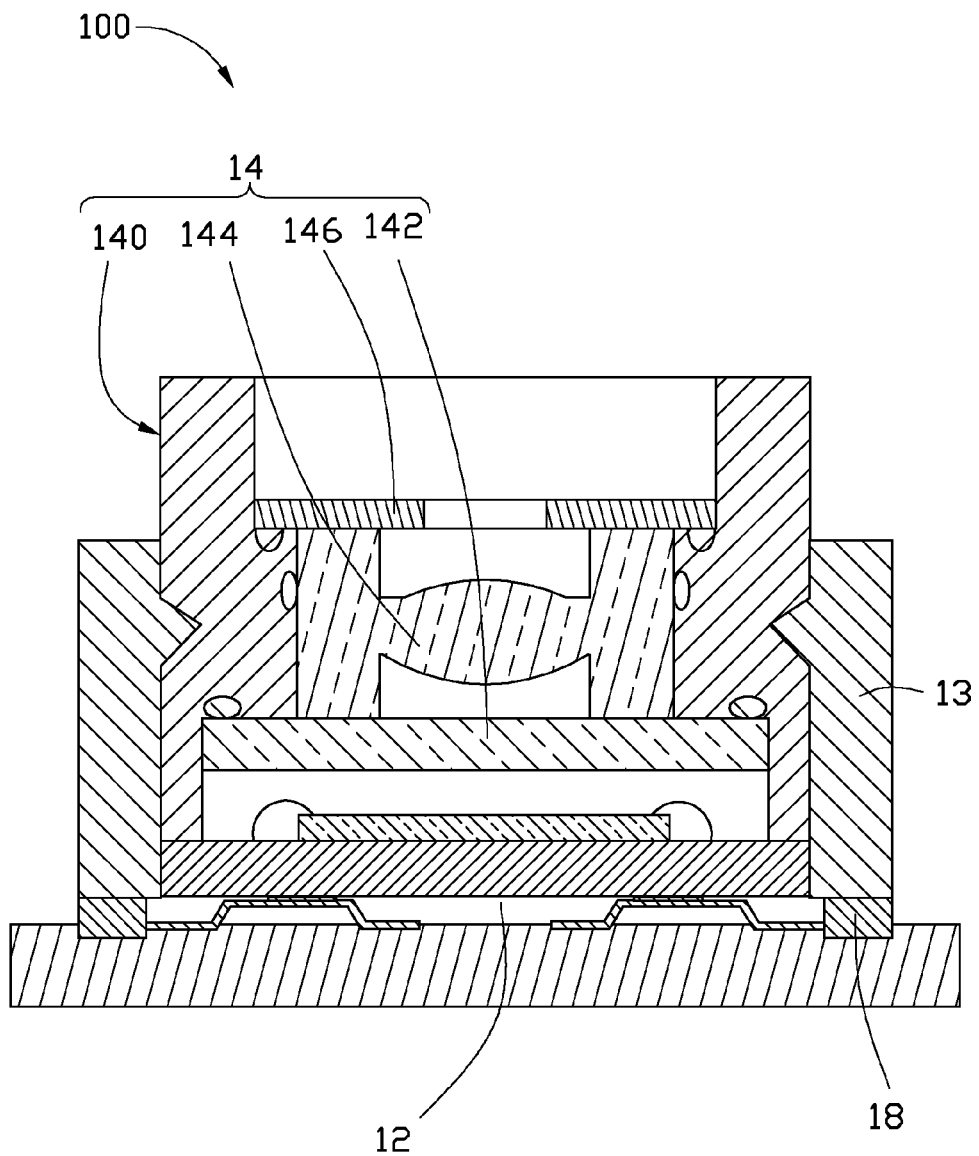
FIG. 2 is a cross-sectional view of the camera module of FIG. 1, taken along line II-II, the camera module mainly including an image sensor package, an enclosure, and a barrel.

Referring to FIGS. 1 and 2, a camera module assembly 100 according to a first embodiment is shown. The camera module assembly 100 includes an image sensor package 12, an enclosure 13, and a lens module 14. The lens module 14 is detachably mounted to the enclosure 13. The enclosure 13 is attached to the image sensor package 12 via an adhesive 18.

Figure 3:
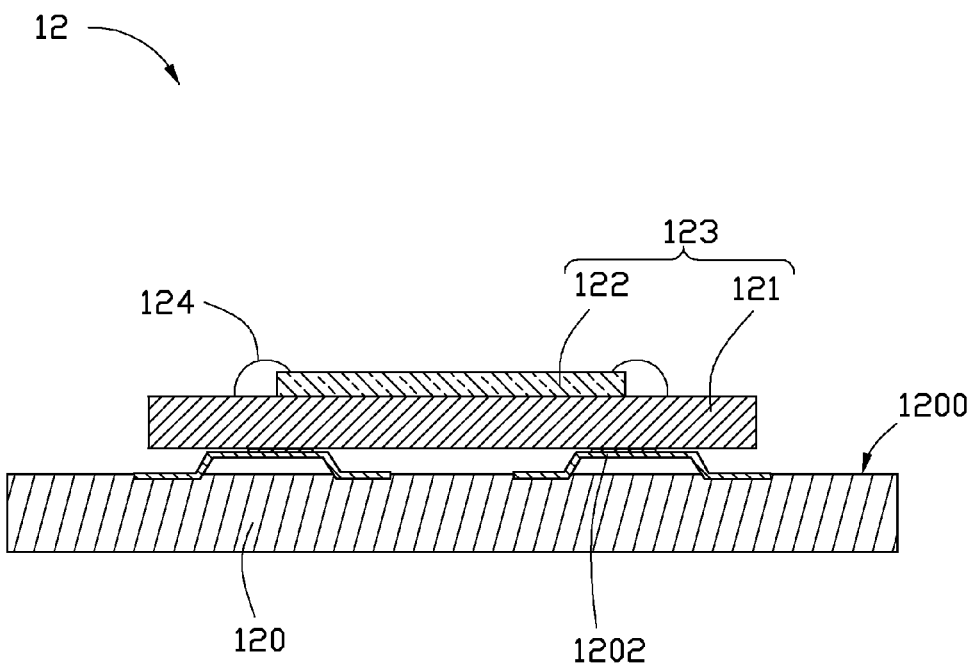
FIG. 3 is a cross-sectional view of the image sensor package of FIG. 2.

Referring also to FIG. 3, the image sensor package 12 includes a circuit board 120, a base substrate 121, and an image sensor 123. The image sensor 123 includes an image sensor chip 122 and a number of wires 124. The circuit board 120 may be a printed circuit board (PCB), and includes a mounting surface 1200 and a number of base pads 1202. The base pads 1202 are mounted on the mounting surface 1200 via surface mount technology (SMT), and the base substrate 121 is connected to the circuit board 120 via the base pads 1202. The image sensor chip 122 is attached to the base substrate 121 facing away from the circuit board 120. In this embodiment, the base pads 1202 are elastic for protecting the image sensor 123 on the base substrate 121 from vibration. The image sensor 123 can be a charge coupled device or a complementary metal-oxide-semiconductor. The wires 124 are configured to electrically connect the image sensor chip 122 to the base substrate 121. The circuit board 120 can provide an electric current to the image sensor chip 122 through the base pads 1202 and the base substrate 121.

Figure 4:
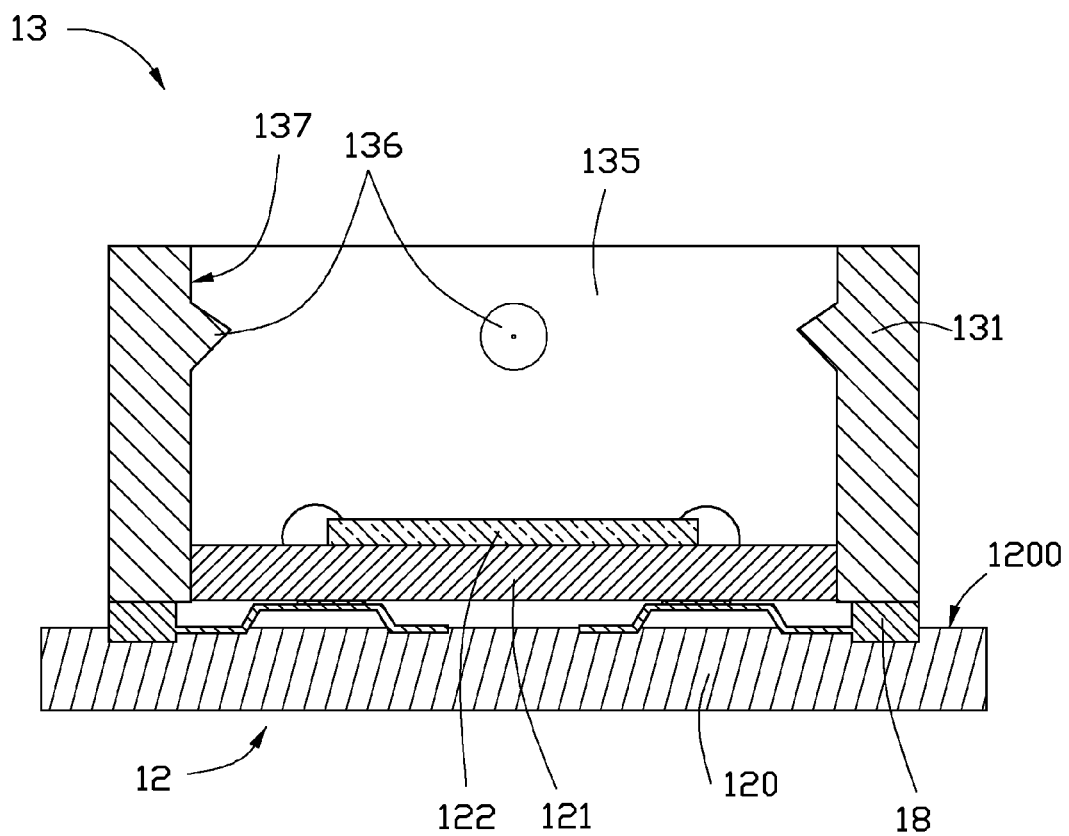
FIG. 4 is similar to FIG. 3, but showing the enclosure attached to the image sensor package.

Referring also to FIG. 4, the enclosure 13 is mounted on the mounting surface 1200 of the circuit board 120. In this embodiment, the enclosure 13 can be made of rubber. The enclosure 13 has a generally cuboid shape, and has a receiving chamber 135 defined in the central region thereof. The receiving chamber 135 is a through hole, and is substantially rectangular. The enclosure 13 includes four peripheral sides, for example, two parallel first peripheral sides 131 and two parallel second peripheral sides 132. Each of the first peripheral sides 131 is located between and adjoins the two second peripheral sides 132 (see FIG. 1). The enclosure 13 further includes a number of elastic engaging portions 136 protruding from an interior surface 137 defined in the receiving chamber 135. Each of the engaging portions 136 may have a prism shape, for example, a generally cuboid shape. Alternatively, the elastic engaging portion 136 may have a generally cylindrical shape, pyramidal shape, disk shape, or conical shape. In this embodiment, the elastic engaging portion 136 has a generally conical shape, as shown in FIG. 4. There are four elastic engaging portions 136, and the four elastic engaging portions 136 protrude from the first and the second peripheral sides 131, 132 respectively. The four elastic engaging portions 136 are located on a common plane (not shown) substantially parallel to the mounting surface 1200. In assembling the enclosure 13 to the image sensor package 12, the adhesive 18 is applied on the mounting surface 1200. The enclosure 13 is attached to the adhesive 18, with the base substrate 121 and the image sensor chip 122 being received in the receiving chamber 135. Thus, the adhesive 18 fixes the enclosure 13 to the circuit board 120.

Figure 5:
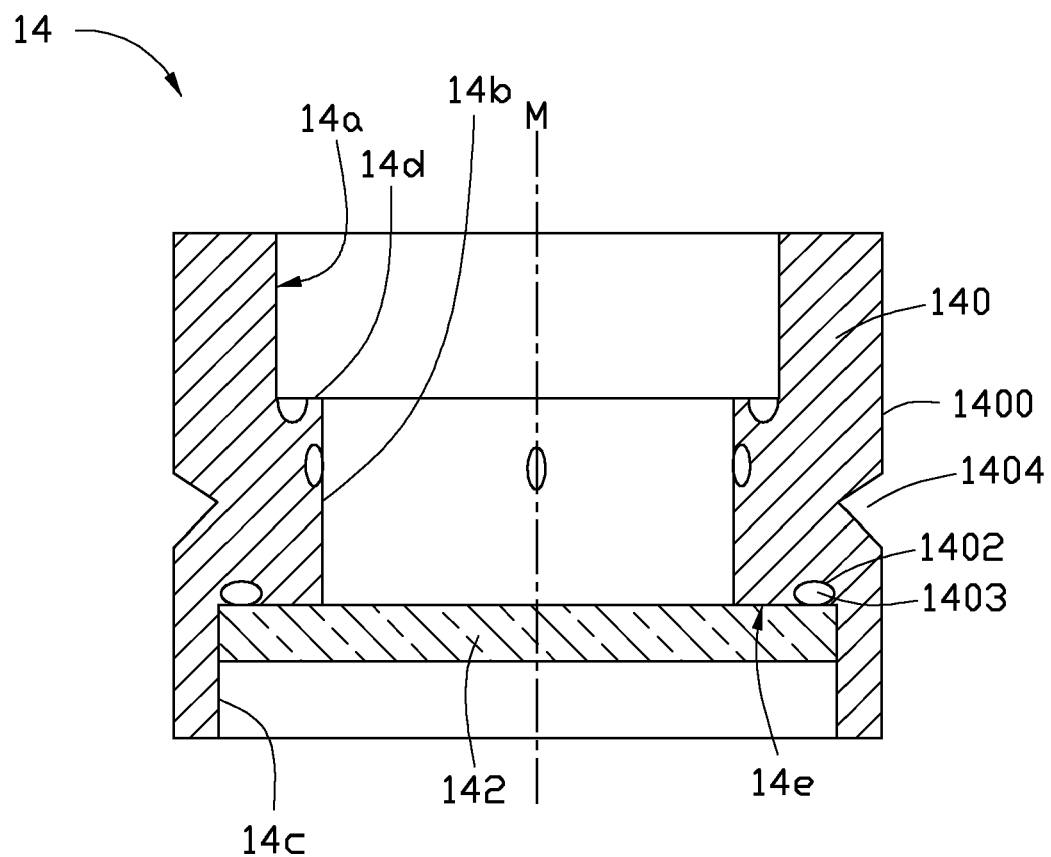
FIG. 5 is a cross-sectional view of the barrel of FIG. 2, with a filter arranged therein.
Figure 6:
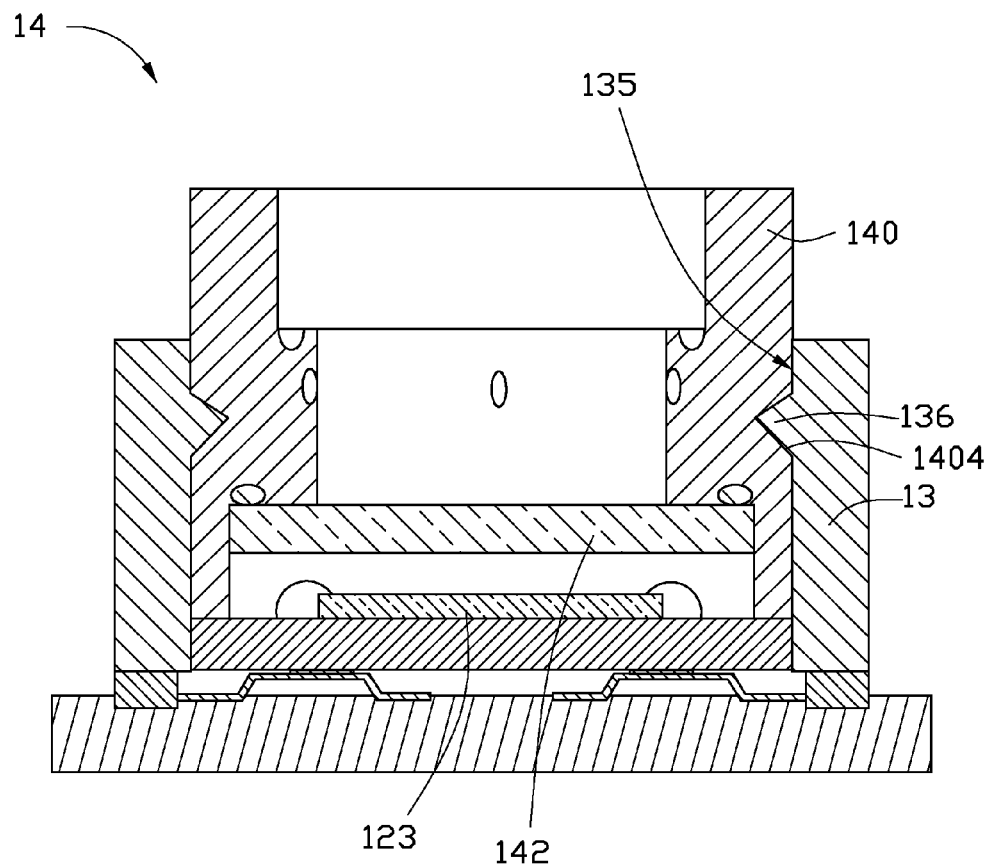
FIG. 6 is similar to FIG. 4, but showing the barrel of FIG. 4 detached from the enclosure of FIG. 4.

Referring also to FIGS. 5 and 6, the lens module 14 includes a barrel 140, and at least one optical element (not labeled). In this embodiment, the barrel 140 has a generally cuboid shape. The barrel 140 is substantially the same size as the receiving chamber 135. Thus, the barrel 140 can be fittingly received in the receiving chamber 135 when mounted to the enclosure 13, as shown in FIG. 6. In alternative embodiments, the barrel 140 may have another shape, for example, a generally cylindrical shape, if the receiving chamber 135 is round, such that the barrel 140 can be fittingly received in the receiving chamber 135 of the enclosure 13. The barrel 140 defines a central axis M, and includes an outer surface 1400 around the central axis M. The outer surface 1400 has a number of recesses 1404 defined therein. The number of the recesses 1404 is equal to that of the elastic engaging portions 136. The recesses 1404 have the same shape as the engaging portions 136. In one typical example, the recess 1404 has a generally circular conical shape. In assembling the barrel 140 to the enclosure 13, the barrel 140 in inserted into the receiving chamber 135 until the elastic engaging portions 136 are fittingly engaged with the respective recesses 1404 of the barrel 140 (see FIG. 6).

The barrel 140 further includes a first hole 14a, a second hole 14b, and a third hole 14c defined in the central region thereof. The first, the second, and the third holes 14a, 14b, 14c are arranged in sequence along the central axis M, and communicate with one another. In particular, the first hole 14a is generally rectangular. The second and the third holes 14b, 14c each are generally round. The second hole 14b is smaller than either of the first and the third holes 14a, 14c. In this embodiment, the barrel 140 includes a first flat surface 14d defined in the first hole 14a, and a second flat surface 14e defined in the third hole 14c. The first flat surface 14d is located between and adjoins a first inner surface (not labeled) of the first hole 14a and a second inner surface (not labeled) of the second hole 14b. The second flat surface 14e is located between and adjoins the second inner surface of the second hole 14b and a third inner surface of the third hole 14c.

The barrel 140 may further have a number of micro-recesses 1402 defined in the second inner surface of the second hole 14a, the first flat surface 14d, and the second flat surfaces 14e. In such case, the at least one optical element can be attached in the barrel 140 by applying an adhesive 1403 in the micro-recesses 1402, as shown in FIG. 5. In one typical example, the at least one optical element may include a filter, such as an infrared-cut filter (IR-cut filter) 142. The IR-cut filter 142 is received in the third hole 14c, and is attached to the second flat surface 14e via the adhesive 1403 in the micro-recesses 1402 (see FIG. 5). The IR-cut filter 142 can be used to block transmission of IR light to the image sensor 123.

Figure 7:
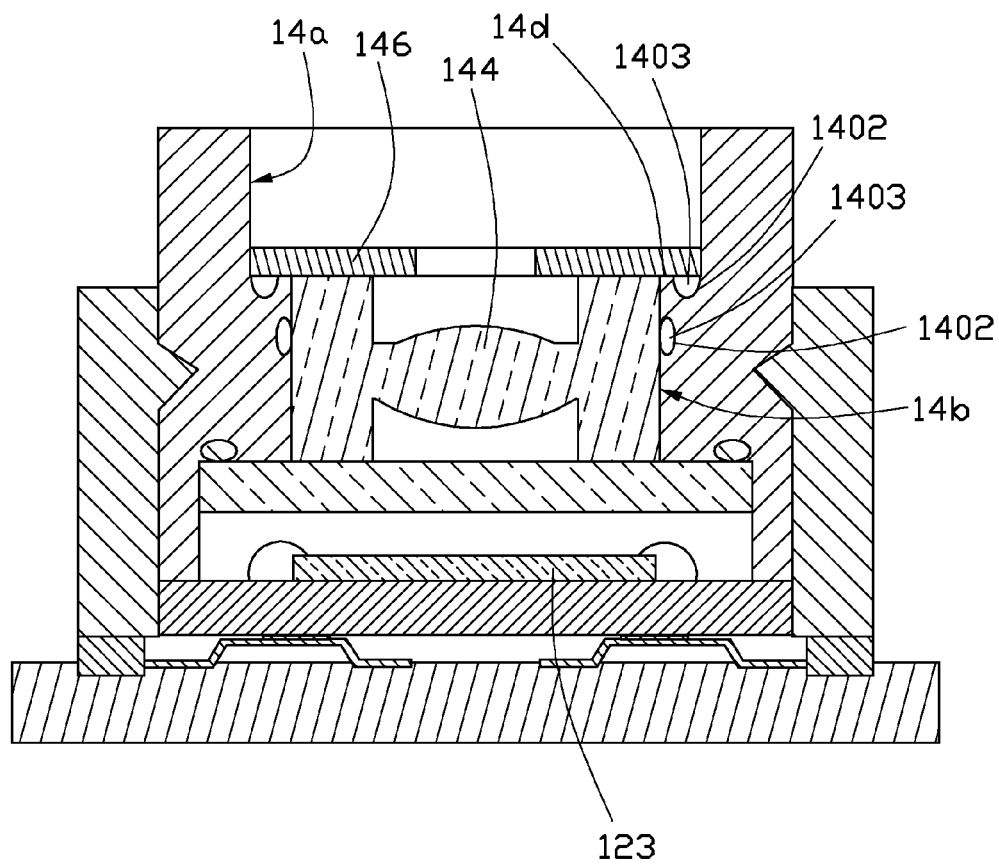
FIG. 7 is similar to FIG. 6, but showing a lens and a shielding plate arranged in the barrel.

Referring to FIG. 7, the at least one optical element may further for example, include a lens 144 and a shielding plate 146. The lens 144 is received in the second hole 14b, and is attached to the second inner surface of the second hole 14b via the adhesive 1403 in the micro-recesses 1402. The lens 144 faces the image sensor chip 123 to be able to form a focused image on the image sensor chip 123. The shielding plate 146 is received in the first hole 14a, and is attached to the first flat surface 14d via the adhesive 1403 in the recesses 1402. In a typical application, the shielding plate 146 is used to control the amount of light transmitted through the lens 144.

One advantage of the camera module 100 is that the camera module 100 is equipped with an enclosure 13 with a number of engaging portions 136. During assembly, engagement of the elastic engaging portions 136 and the recesses 1404 ensure that the barrel 140 is securely connected to the enclosure 13. Another advantage of the camera module 100 is that the barrel 140 can be detached from the enclosure 13 by pulling the barrel 140 and the enclosure 13 in two opposite directions along the central axis M of the barrel 140. Therefore, the barrel 140 can be replaced or repaired easily.

Figure 8:
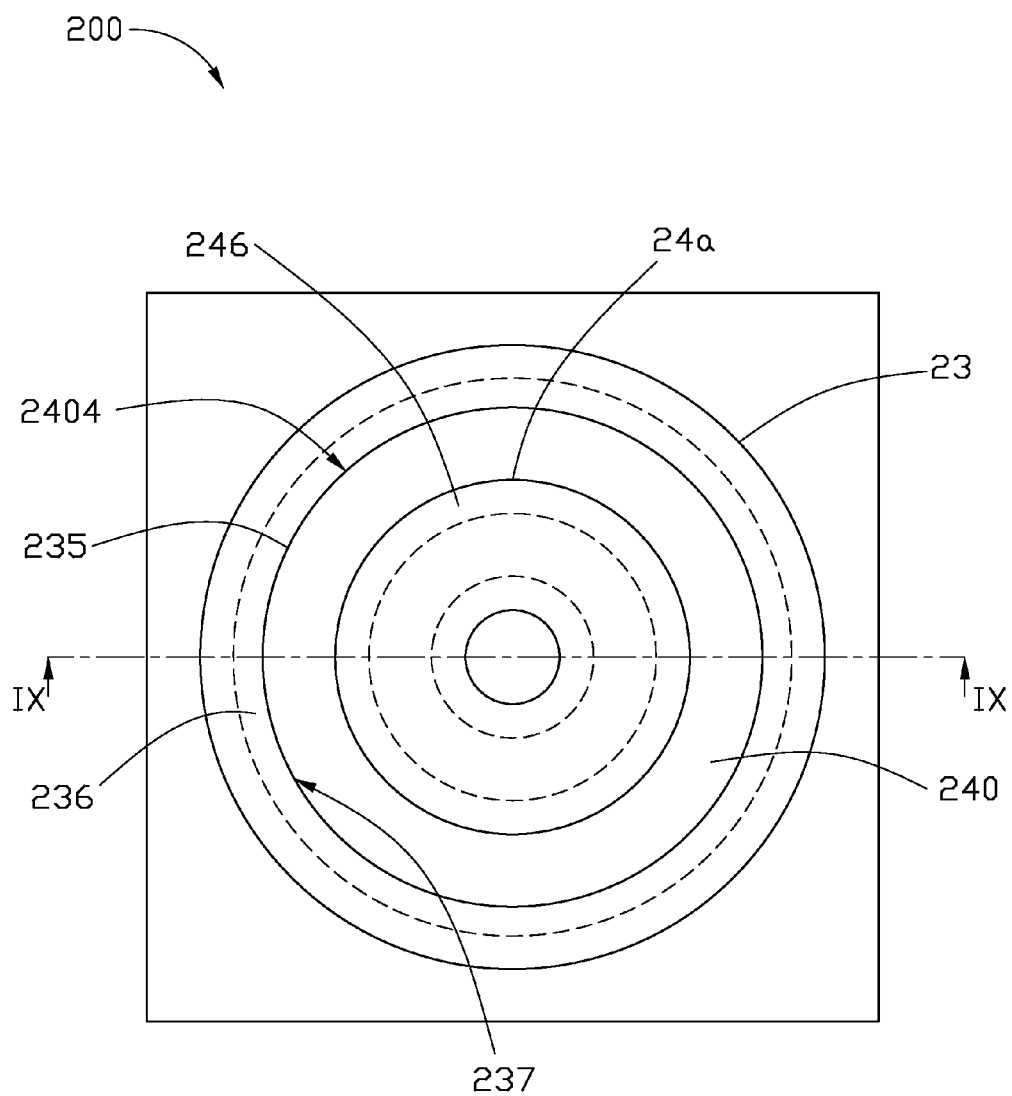
FIG. 8 is a top plan view of a camera module according to a second embodiment.
Figure 9:
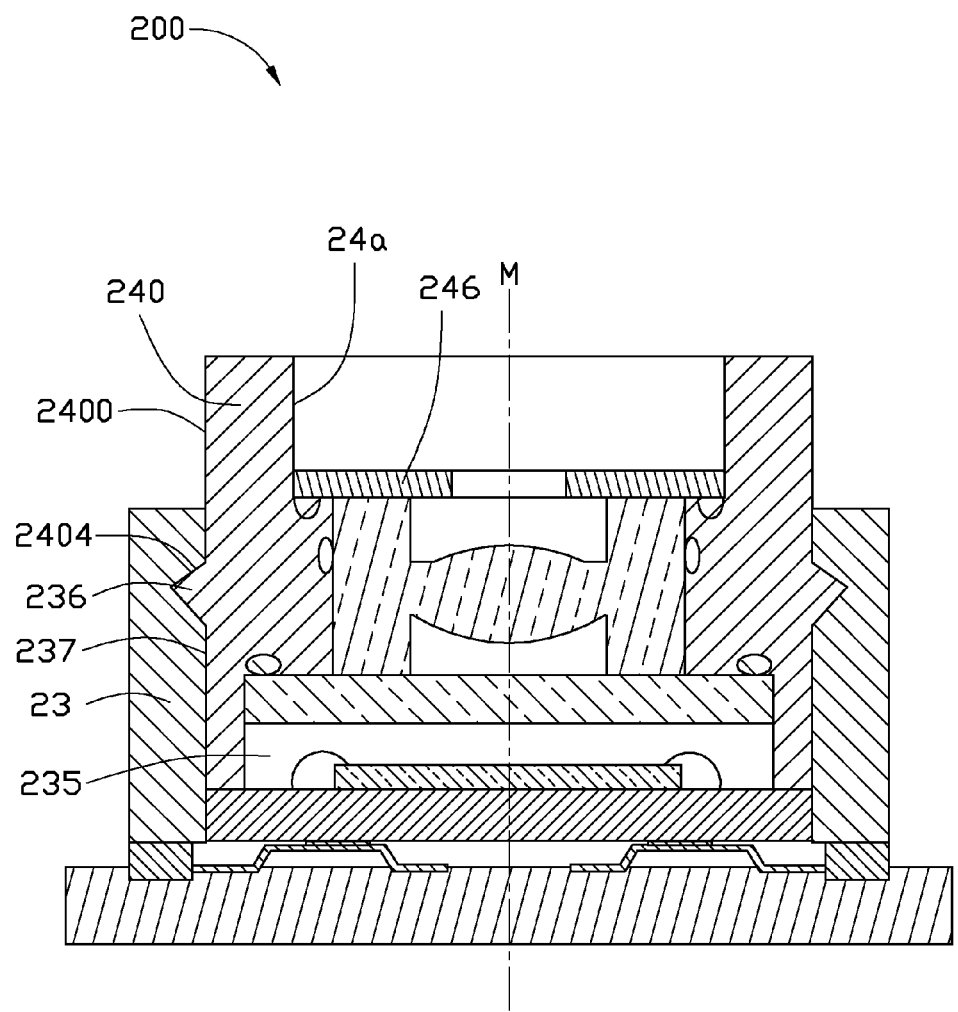
FIG. 9 is a sectional view of a camera module of FIG. 8, taken along line IX-IX.

FIGS. 8 and 9 illustrates a camera module 200, according to a second embodiment. The camera module 200 is similar to the camera module 100 of the first embodiment, and includes an enclosure 23 and a barrel 240. However, for the camera module 200, only one elastic engaging portion 236 is provided, and the elastic engaging portion 236 need not protrude from an interior surface 237 of the enclosure 23. Instead, the engaging portion 236 protrudes from an outer surface 2400 of the barrel 240. Accordingly, the interior surface 237 of the enclosure 23 defines a recess 2404 for receiving the engaging portion 236 during assembly. In this embodiment, the enclosure 23 has a generally cylindrical shape. The receiving chamber 235 and is round (see FIG. 8). In addition, the engaging portion 236 is annular and surrounds the central axis M of the barrel 240. A transverse section of the engaging portion 236 is generally triangular (see FIG. 9). Furthermore, a first hole 24a of the barrel 240 and a shielding plate 246 received in the first hole 24a are both round.

It can be understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. A camera module comprising:
    an image sensor package comprising:
    a circuit board having a mounting surface,
    an image sensor mounted on the mounting surface of the circuit board, the image sensor being electrically connected to the circuit board;
    an enclosure attached on the mounting surface of the circuit board and defining a receiving chamber therein, the enclosure comprising an interior surface in the receiving chamber and a plurality of elastic engaging portions integrally formed with the enclosure and protruding from the interior surface;
    a lens module comprising:
    a barrel and at least one optical element received in the barrel, the barrel defining a central axis and comprising an outer surface around the central axis, the barrel defining a plurality of recesses in the outer surface, the barrel being detachably mounted in the receiving chamber of the enclosure, only by the engagement of the engaging portions and engaging in the respective recesses,
    wherein the elastic engaging portions are located on a common plane substantially parallel to the mounting surface, and
    wherein the enclosure has a generally cuboid shape, the receiving chamber is generally rectangular, and the enclosure comprises two parallel first peripheral sides and two parallel second peripheral sides, each of the first peripheral sides is located between and adjoins the two second peripheral sides, the plurality of elastic engaging portions comprises four engaging portions protruding from the respective first and second peripheral sides.

2. The camera module of claim 1, wherein the enclosure has a generally cylindrical shape, and the receiving chamber has a generally round cross-section.

3. The camera module of claim 1, wherein each elastic engaging portions has a shape selected from the group consisting of a generally cuboid shape, a generally cylindrical shape, a generally pyramidal shape, and a generally conical shape.

4. The camera module of claim 1, further comprising an adhesive, the enclosure being attached to the circuit board with the adhesive.

5. The camera module of claim 1, further comprising a plurality of elastic base pads mounted on the mounting surface of the circuit board, the image sensor being mounted on the circuit board and electrically connected to the circuit board via the elastic base pads.

6. The camera module of claim 1, wherein a dimension of a receiving chamber is substantially same as that of the cross-section of the barrel, and the barrel is fittingly received in the receiving chamber when the barrel is mounted to the enclosure.

7. The camera module of claim 1, wherein the at least one optical element includes a lens, and the barrel defining a hole therein receiving the lens, and an inner surface in the hold with a plurality of recesses defined therein filled with adhesive, the lens is attached to the inner surface with the adhesive.

8. The image sensing module of claim 7, wherein the at least one optical element further comprises a filter, and the filter is arranged between the lens and the image sensor.

9. The image sensing module of claim 8, wherein the at least one optical element comprises a shielding plate, and the shielding plate is arranged at a side of the lens facing away from the filter.

10. The image sensing module of claim 1, wherein the enclosure is made of rubber.

11. A camera module comprising:
an image sensor package comprising:
a circuit board having a mounting surface,
an image sensor mounted on the mounting surface of the circuit board, the image sensor being electrically connected to the circuit board;
an enclosure attached on the mounting surface of the circuit board and defining a receiving chamber therein, the enclosure comprising an interior surface in the receiving chamber and an annular recess defined in the interior surface;
a lens module comprising:
a barrel and at least one optical element received in the barrel, the barrel defining a central axis and comprising an outer surface around the central axis,
the barrel comprising an elastic engaging portion integrally formed with the barrel and protruding from the outer surface, the barrel being detachably mounted in the receiving chamber of the enclosure, only by the engagement of the engaging portion and in the recess,
wherein the elastic engaging portions are located on a common plane substantially parallel to the mounting surface, and
wherein the enclosure has a generally cuboid shape, the receiving chamber is generally rectangular, and the enclosure comprises two parallel first peripheral sides and two parallel second peripheral sides, each of the first peripheral sides is located between and adjoins the two second peripheral sides, the plurality of elastic engaging portions comprises four engaging portions protruding from the respective first and second peripheral sides.

12. The camera module of claim 11, wherein the elastic engaging portion is located on a plane substantially parallel to the mounting surface.

13. The camera module of claim 11, wherein a transverse cross section of the engaging portion is generally triangular.

14. The camera module of claim 11, wherein the enclosure has a generally cylindrical shape, and the receiving chamber has a generally round cross-section.

15. The camera module of claim 11, further comprising an adhesive, the enclosure being attached to the circuit board with the adhesive.

16. The camera module of claim 11, further comprising a plurality of elastic base pads mounted on the mounting surface of the circuit board, the image sensor being mounted on the circuit board and electrically connected to the circuit board via the elastic base pads.

17. The camera module of claim 11, wherein a dimension of a receiving chamber is substantially same as that of the cross-section of the barrel, and the barrel is fittingly received in the receiving chamber when the barrel is mounted to the enclosure.

18. The camera module of claim 11, wherein the at least one optical element includes a lens, and the barrel defining a hole therein receiving the lens, and an inner surface defined in the hold has a plurality of recesses defined therein filled with adhesive, the lens is attached to the inner surface with the adhesive.

* * * * *